United States Patent [19]

Kurosawa

[11] Patent Number: 4,874,719
[45] Date of Patent: Oct. 17, 1989

[54] METHOD FOR MANUFACTURING AN ELECTRICAL CONNECTION BETWEEN CONDUCTOR LEVELS

[75] Inventor: Kei Kurosawa, Tokyo, Japan
[73] Assignee: Kabushiki Kaisha Toshiba, Kawasaki, Japan
[21] Appl. No.: 221,008
[22] Filed: Jul. 18, 1988

Related U.S. Application Data

[63] Continuation of Ser. No. 44,208, Apr. 30, 1987, abandoned.

[30] Foreign Application Priority Data

May 6, 1986 [JP]   Japan ................................. 61-103413

[51] Int. Cl.$^4$ .................... H01L 21/283; H01L 21/31
[52] U.S. Cl. .................................. 437/195; 437/192; 437/203; 437/246; 437/49; 148/DIG. 20; 148/DIG. 26; 357/71
[58] Field of Search ............... 437/193, 200, 192, 189, 437/195, 203, 48, 228, 246, 49; 357/71; 148/DIG. 20, DIG. 26

[56] References Cited

U.S. PATENT DOCUMENTS

| | | | |
|---|---|---|---|
| 4,322,736 | 3/1982 | Sasaki et al. | 357/59 |
| 4,403,394 | 9/1983 | Shepard et al. | 29/571 |
| 4,441,247 | 4/1984 | Gargini et al. | 29/571 |
| 4,581,623 | 4/1986 | Wang | 357/23.7 |
| 4,582,563 | 4/1986 | Hazuki et al. | 156/643 |
| 4,616,401 | 10/1986 | Takeuchi | 29/571 |
| 4,619,037 | 10/1986 | Taguchi et al. | 29/578 |
| 4,663,831 | 5/1987 | Birrittella et al. | 148/DIG. 11 |
| 4,696,097 | 9/1987 | McLaughlin et al. | 437/193 |

OTHER PUBLICATIONS

Smith et al., *Proc. VLSI Multilevel Interconnect Conf.*, 403 (1986).
Itoh et al., *IEDM Tech. Digest*, 1985, pp. 606–609.

Primary Examiner—Brian E. Hearn
Assistant Examiner—T. N. Quach
Attorney, Agent, or Firm—Oblon, Spivak, McClelland, Maier & Neustadt

[57] ABSTRACT

Disclosed is a method for making connection between conductor layers through a contact via comprising the steps of (a) forming a first conductive pattern on a semiconductor substrate, (b) forming an insulation interlayer so that it covers the first conductive pattern, (c) forming, on the insulation interlayer, a conductive film of which a second conductive pattern is formed, (d) forming a contact hole, at a predetermined location, in both the conductive film and the insulation interlayer, so that the contact hole reaches the first conductive pattern, (e) forming the conductive layer at least in the contact hole, to make an electrical connection between the conductive film and the first conductive pattern, and (f) subsequent to the formation of the conductive film by step (e), selectively etching the conductive film and the conductive layer, to form said second conductive pattern. In an alternative embodiment, the second conductive pattern is obtained by selectively etching the conductive film prior to the formation of the contact hole, and the electrical connection is formed by selective CVD.

9 Claims, 9 Drawing Sheets

METHOD FOR MANUFACTURING AN ELECTRICAL CONNECTION BETWEEN CONDUCTOR LEVELS

This application is a Continuation of application Ser. No. 044,208 filed on Apr. 30, 1987, now abandoned.

BACKGROUND OF THE INVENTION

This invention relates to a method for manufacturing a semiconductor device and, in particular, to a method for connecting wiring layers, which is suited to the manufacture of a semiconductor integrated circuit having very narrow wiring layers.

DESCRIPTION OF THE PRIOR ART

In the formation of the electrodes or wiring layers of a semiconductor integrated circuit, use is made of various types of layers, such as a diffusion layer, polycrystalline silicon layer, metal silicide film, and Al film. In the semiconductor device having a multilayer wiring structure in particular, individual wiring layers having various material compositions can be used in combination. In order to form a desired circuit, it is necessary to connect the respective wiring layers forming the multilayer wiring structure.

The conventional method for connecting the wiring layers will now be explained below, with reference to FIGS. 1A to 1C.

As is shown in FIG. 1A, insulating film 12 is formed on the surface of Si-substrate 11. The resultant structure, after being covered with a polycrystalline silicon layer, is patterned to form first wiring layer 13. As is shown in FIG. 1B, subsequent to covering the resultant structure with insulation interlayer 14, contact hole 15 is formed at a predetermined location in insulation interlayer 14 to expose first wiring layer, and the resultant structure is covered with, for example, an Al film as a second wiring layer, in which case it is connected, as necessary, to the first wiring layer through contact hole 15. By means of a selective etching step, the resultant structure is provided with a desired wiring pattern, to thereby form second wiring layer 16, connected to first wiring layer 13 through contact hole 15, as is shown in FIG. 1C.

Using this conventional method, the following drawbacks have been encountered in the process of forming very narrow wiring layers:

Firstly, if minute contact hole 15 having a vertical side wall is formed by an anisotropic dry etching method, such as by reactive ion etching, the second wiring layer is deposited with inadequate thickness on the side wall portion of the contact hole, causing second wiring layer 16 on the side wall portion of the contact hole to become thinner than is desirable, as is shown in FIG. 1C, or sometimes causing gaps in the layer. This results in an inadequate electrical connection between first and second wiring layers 13 and 16, or else second wiring layer 16 is unable to reliably perform its intended function.

Secondly, it will be necessary to make second wiring layer 16 wider at contact hole 15 than the remaining portion thereof. The reason is that if second wiring layer 16 is formed narrower than the size of contact hole 15, the contact hole wall is then partially exposed at the time of etching, with the result that first wiring layer 13 is etched by etchant passing through the exposed wall portion of the contact hole. If the second wiring layer is widened at contact hole 15, in order to avoid the aforementioned drawback, then wiring layer $16_1$ is formed in close proximity to wiring layer $16_2$ so that, as is shown in FIG. 2, for example, the distance between wiring layers $16_1$ and $16_2$ is less (distance $d_1$) where layer $16_1$ broadens at contact hole 15, than it is (distance $d_2$) when both these layers are their normal width. This means that distance $d_2$ between wiring layers $16_1$ and $16_2$ cannot be narrowed down to a minimum working dimension, in which case, therefore, distance $d_1$ is the minimum working dimension.

It has been increasingly demanded for integrated circuits to be made of smaller elements and thus having a higher packing density. Due the drawbacks described above, the conventional method cannot provide reliable integrated circuits having a high packing density.

SUMMARY OF THE INVENTION

The object of this invention is to provide a method for manufacturing a semiconductor device, whereby reliable electrical connection can be achieved between wiring layers, through utilizing a very small contact hole, and whereby elements can be highly and effectively integrated in a high packing density, by reducing the distance between the wiring layers. That object of this invention is achieved by the following steps (a) to (f) which consist of:

(a) forming a first conductive pattern on a semiconductor substrate;

(b) forming an insulation interlayer so that it covers the first conductive pattern;

(c) forming, on the insulation interlayer, a conductive film of which a second conductive pattern is formed;

(d) forming a contact hole, at a predetermined location, in both the conductive film and insulation interlayer, so that the contact hole reaches the first conductive pattern;

(e) forming a conductive layer at least in the contact hole, to make an electrical connection between the conductive film and the first conductive pattern; and (f) subsequent to the formation of the conductive film by step (c) but prior to the formation of the contact hole by step (d), selectively etching the conductive film, to form the second conductive pattern.

In the aforementioned manufacturing method, since the second conductive pattern is formed by step (f), no contact hole is yet formed when the conductive film is to be formed and, in this case, it is possible to completely prevent the first conductive pattern from being over-etched, by etchant passing through the contact hole. As a result, the distance between the respective second wiring layers can be reduced down to a minimum working dimension, without the need to enlarge the second wiring layer at the contact area. Thus, the wiring layers can be formed in a high packing density.

It is desirable that the conductive layer be formed in the contact hole wall during step (e), by use of a selective CVD method using a metal compound gas. If this method is used under predetermined conditions, a metal film is grown along the side wall of the contact hole, from the first conductive pattern, due to the "creeping-up" phenomenon - IEDM Tech. Digest pp 606 to 609 (1985), and thus the second conductive pattern will not be of reduced thickness, as in the case of the conventional method, at the side wall of the very small hole. Using the above method, it is therefore possible to obtain a wiring layer structure having high reliability.

It is desirable that the conductive layer be formed such that the contact hole is completely filled with layer material. By doing so, it is possible to improve the surface flatness of the second conductive pattern.

The object of this invention can also be achieved by forming the conductive layer such that the contact hole is completely filled with layer material at step (e) and forming a second conductive pattern after step (e), by means of selective etching of the conductive film.

In this case, unlike in the aforementioned manufacturing method, the second wiring layer is patterned subsequent to the forming of the contact hole. This method is the same as the conventional method in this respect, but the contact hole, unlike in the case of FIG. 1C, is completely filled with conductive layer material. For this reason, the first wiring layer can be prevented from being etched by etchant passing through the contact hole and thus the second wiring layer need not be widened at the contact hole area, thereby making it possible to obtain a wiring layer structure with a high integration density.

DETAILED DESCRIPTION OF THE PREFERRED EMBODIMENTS

The embodiment of this invention will now be explained below.

First, the method for making a wiring layer structure according to one embodiment of this invention will now be explained below with reference to FIGS. 3A through 3D.

Figure 3A:
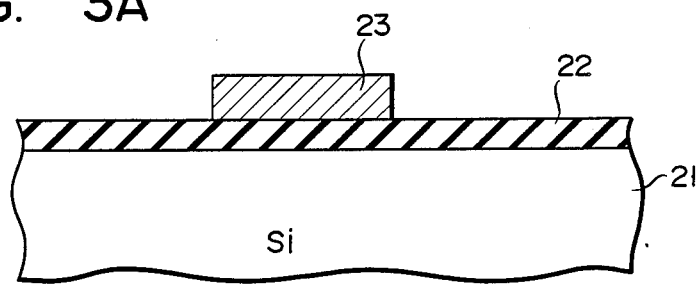
FIGS. 3A to 3D are views showing the steps of manufacturing a wiring layer structure according to one embodiment of this invention.
Figure 3B:
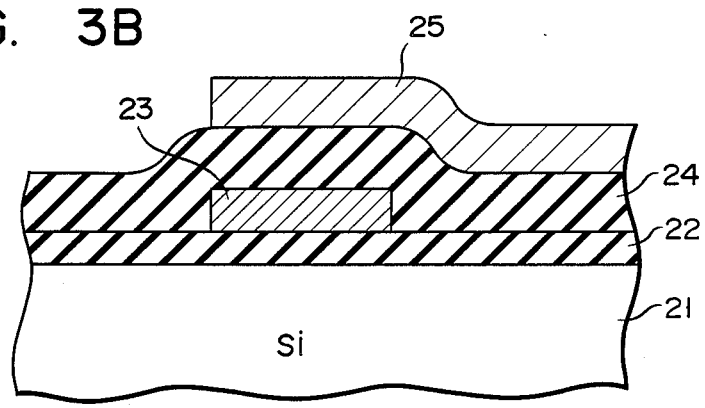
Figure 3C:
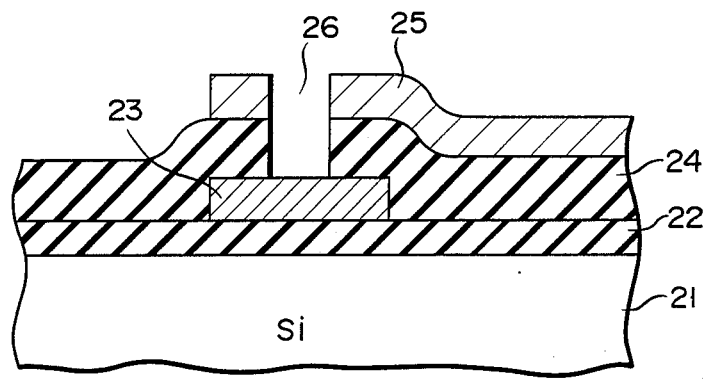
Figure 3D:
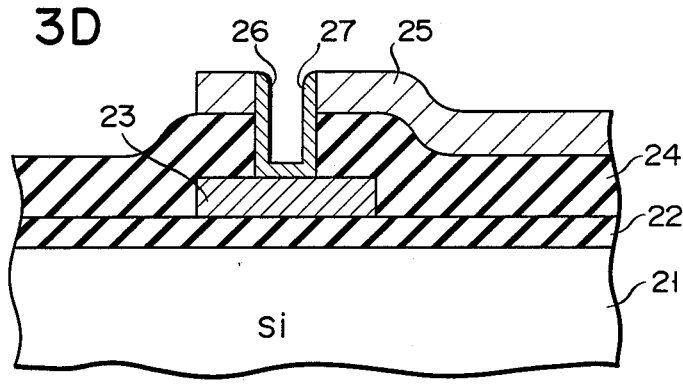

As shown in FIG. 3A, first wiring layer 23 of poly-Si is formed on insulation film 22 overlying Si substrate 21 in which predetermined diffusion layers have been formed. That is, for example, a 4000 Å-thick P-doped poly-Si film is formed on the aforementioned substrate and the surface of the resultant substrate is patterned by the ordinary method to form first wiring layer 23. Then SiO$_2$ film of about 1 $\mu$m in thickness is deposited as insulation interlayer 24 on the surface of the resultant structure, as shown in FIG. 3B, by virtue of a CVD method. An Al film about 0.8 $\mu$m thick is deposited on the resultant structure, and the surface of the resultant structure is patterned to form second wiring layer 25. As shown in FIG. 3C, contact hole 26 is formed at a contact formation area where an electric connection is to be made between first and second wiring layers 23 and 25 through insulation interlayer 24. Then a selective CVD method is carried out with the use of WF$_6$/Ar gas as shown in FIG. 3D. As a result, W film 27 is selectively grown on contact hole 26 and on first wiring layer 23 of poly-Si. This is probably due to the fact that the reduction reaction, involving WF$_6$, as given below occurs on the surface of the poly-Si film.

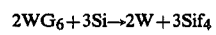

$$2WG_6 + 3Si \rightarrow 2W + 3SiF_4$$

If the selective CVD step is conducted particularly under the conditions of, for example, a substrate temperature of 550° C., intrafurnace pressure of 0.2 Torr and partial pressure of WF$_6$ of 0.01 Torr, W film 27 is grown along the contact hole through a "creeping-up" phenomenon in which case the grown W film 27 is brought in contact with second wiring layer 25 to establish an electric connection between first and second wiring layers 23 and 25. It is to be noted that the aforementioned selective CVD method can be employed in cases where use may be made of not only the WF$_6$ gas but also, for example, a compound gas of high melting point metals, such as Mo, Ta and Ti.

Figure 2:
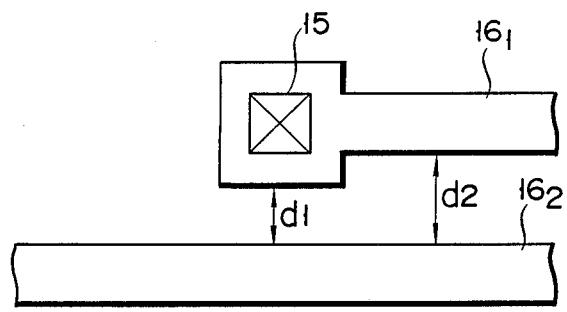
FIG. 2 is a view for explaining problem as encountered in the manufacture of the conventional wire layer structure.
Figure 4:
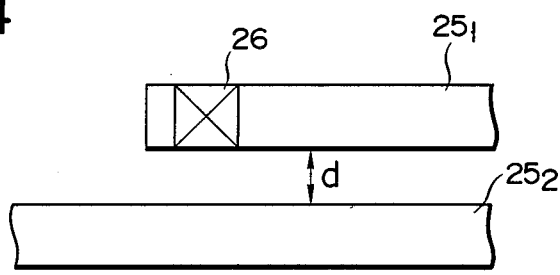
FIG. 4 is a view for explaining the effects of the embodiment of FIGS. 3A to 3D.

According to this invention, if contact hole 26 is small, a positive electric connection between first and second wiring layers 23 and 25 can be created, assuring an electric connection, on a high density integrated circuit, with improved reliability. Since contact hole 26 is formed subsequent to the formation of second wiring layer 25, there is no risk that first wiring layer 23 will be etched during the formation of second wiring layer 25. Thus the wiring layer distance can be reduced down to the minimum working dimension as shown in FIG. 4, since the width of second wiring layer 25 can be made equal to the dimension of contact hole 26. In FIG. 4, 25$_1$ and 25$_2$ show the adjacent second wiring layers. Contact hole 26 is formed with the same dimension as the width of second wiring layer 25. Upon comparison with FIG. 2 it is seen that, in this embodiment, the distance d between wiring layers 25$_1$ and 25$_2$ can be reduced down to the aforementioned minimum working dimension, assuring a wiring layer structure in high integration density.

The detailed conditions under which the selective CVD step is conducted in the formation of W film 27 as set forth above can be properly modified within a predetermined range. The choice can normally be made for the conditions: the substrate temperature of 525° to 575° C., intrafurnace pressure of over 0.01 Torr and partial pressure of WF$_6$ of over 0.01 Torr, for example, 0.01 to 0.5 Torr. Under these conditions, W film 27 is grown due to the aforementioned "creeping-up" phenomenon.

The growth of W film 27 is due to the reduction process of WF$_6$ by Si of first wiring layer 23 and thus much cannot be expected from this growth. For this reason, W film 27 cannot be so formed as to be enough thick and this thickness is around 200 Å at best. If W film 27 is to be formed as a thicker film, further reduction reaction is caused to occur by a WF$_6$ H$_2$ gas, that is, under the H$_2$ gas atmosphere. By doing so, it is possible to obtain an adequately thick W film.

Modifications of the embodiment described above will be explained below with reference to FIGS. 5 to 7. In this modification, a contact structure of wirings is shown in which like reference numerals re employed to designate like parts.

Figure 5:
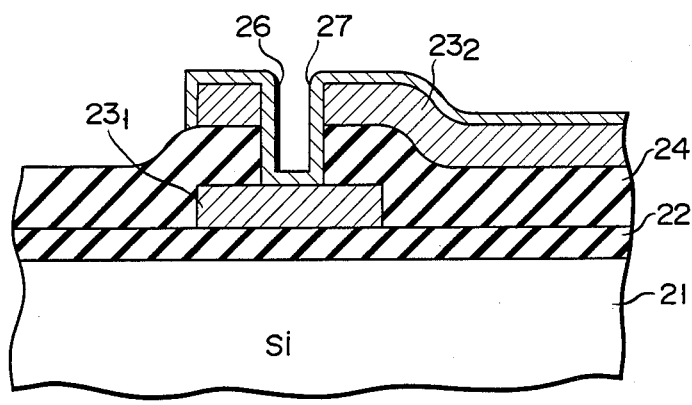
FIGS. 5 to 7 are views showing a modified form of the embodiment of FIGS. 3A to 3D with a contact area formed for the wiring layers.

In the modification shown in FIG. 5, first and second wiring layers $23_1$ and $23_2$ are formed of poly-Si. In this modification, subsequent to the formation of second wiring layer $23_2$, contact hole 26 is formed, followed by the selective CVD of W film 27 in the same fashion as in the preceding embodiment. W film 27 is grown on the whole surface of second wiring layer $23_2$ because second wiring layer $23_2$ is formed of poly-Si. In this case, this structure is advantageous, in making an electric connection between the wiring layers, over the preceding embodiment (FIGS. 3A to 3D) using the Al film as the second wiring layer. This is because the W film is independently formed on the exposed surface of second wiring layer $23_2$ corresponding to part of the side wall of contact hole 26 whereby a positive electric connection can be established between the wiring layers even if the W film is grown from the bottom surface of the contact hole with a smaller amount of "creeping-up".

Figure 6:
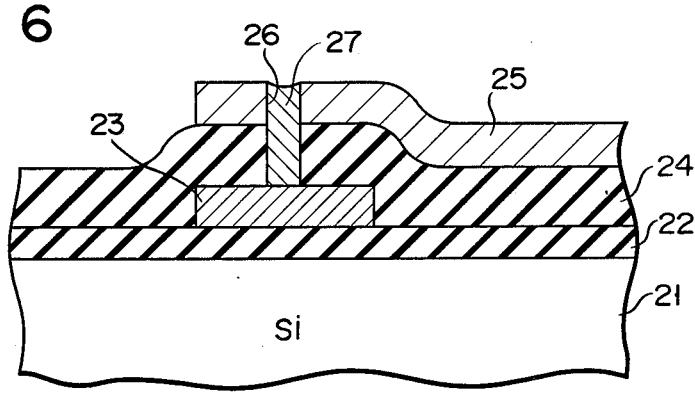

In the modification of FIG. 6, contact hole 26 is completely filled with W film 27. This structure can be adopted in cases where, for example, contact hole 26 is very small. Contact hole 26, even if not very small, can be filled by growing a thin W film in a reactive $WF_6+Ar$ gas atmosphere and further growing the W film as an adequately thick film in a $H_2$ reducing atmosphere with the aforementioned reactive gas replaced by a $WF_6+H_2$ gas. With contact hole 26 completely filled with W film 27 the surface of second wiring layer 27 is flattened, allowing another wiring thereon to be formed with high reliability.

Figure 7:
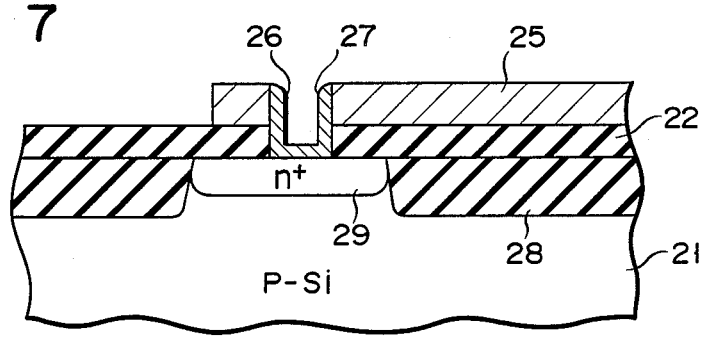

An embodiment of FIG. 7 allows a positive electric connection to be made between diffusion layer 29 in substrate 21 and wiring layer 25. In FIG. 7 reference numeral 28 denotes a field insulating film. Diffusion layer 29, though not normally as the first wiring layer, functions as an electrode or a wiring layer and, in this sense, can be regarded as the first electrode or wiring layer. From this it will be appreciated that this embodiment can naturally be covered within the technical scope of this invention. In this case, diffusion layer 29 may be not only a wiring layer but also a terminal layer, such the source or drain region of the MOS transistor, noting that the contact hole is formed in the same way as in FIGS. 3A to 3D.

Additional embodiments of this invention will be explained below with reference to FIGS. 8A to 8E. In these embodiments the second wiring layer is patterned as a final step.

Figure 8A:
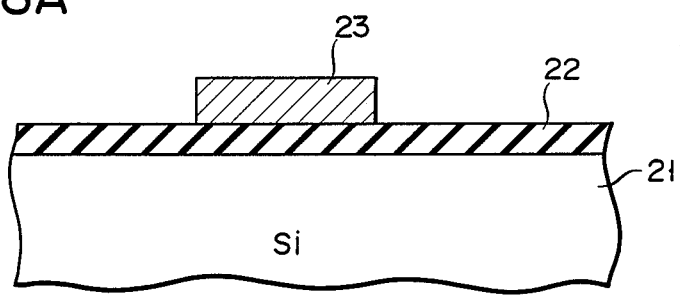
FIGS. 8A to 8F are views showing the steps of forming a wiring layer structure in another embodiment of this invention.
Figure 8B:
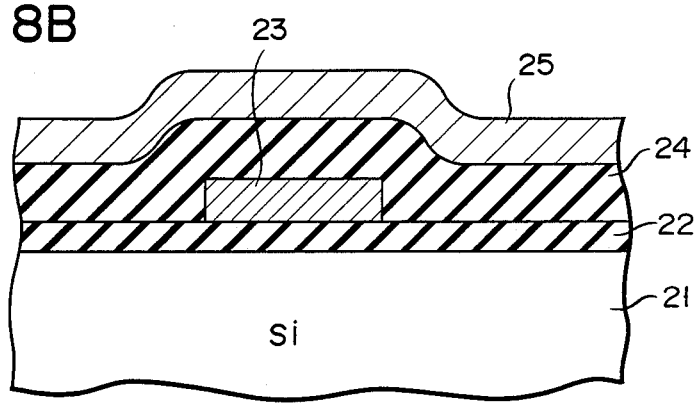
Figure 8C:
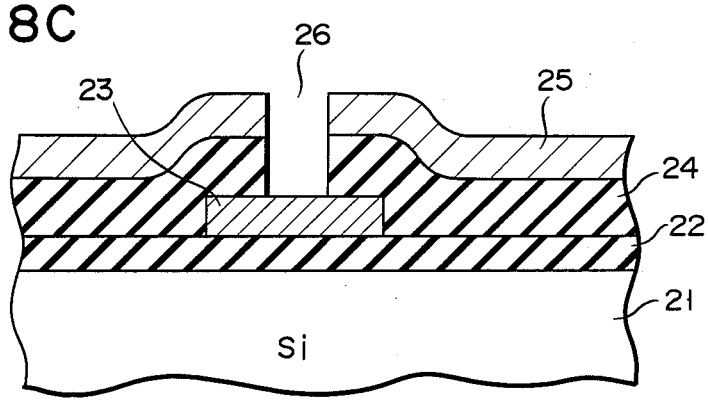
Figure 8D:
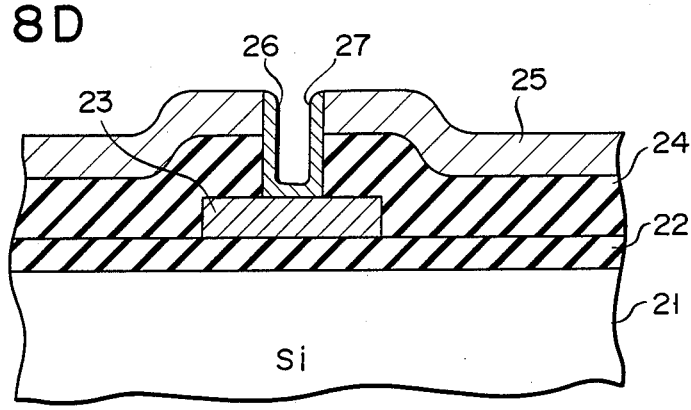
Figure 8E:
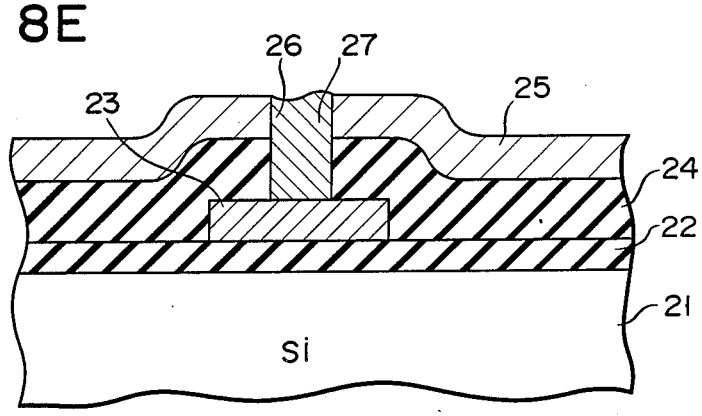
Figure 8F:
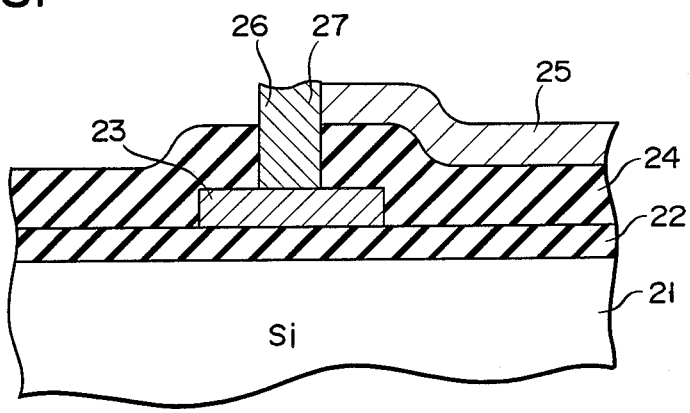
Figure 9:
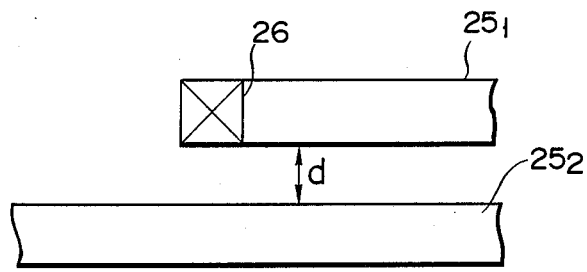
FIG. 9 is a view for explaining the effects of the embodiment of FIGS. 8A to 8F.

As shown in FIG. 8A, insulating film 22 is formed on Si substrate 21 in which predetermined diffusion layers have been formed and first wiring layer 23 of poly-Si is formed on insulating film 22. As shown in FIG. 8B, an Al film around 0.8 μm thick is deposited on the surface of the resultant structure. Up to this point, the conditions of manufacture are the same as in the embodiment of FIG. 3. Then the steps different from those in FIG. 3 are performed in the following way. That is, Al film 25, without being patterned, is pierced as contact hole 26 as shown in FIG. 8C. Then W film 27 is grown, by the same method as explained in FIG. 6, so that contact hole 26 is completely filled with W film 27. That is, W film 27 as shown in FIG. 8D be grown as a thin film in the reactive gaseous atmosphere of $WF_6+Ar$ and further grown, as an adequately thick film as shown in FIG. 8E, in the reducing atmosphere with the reactive gaseous atmosphere replaced by $WF_6+H_2$. Finally, Al film 25 is patterned to form second wiring layer as shown in FIG. 8F. It is possible to take an adequate, selective etching ratio between Al film 25 and W film 27. In this embodiment, the configuration of the second wiring layer can completely be self-aligned with the contact hole portion so that the wiring layers can be formed in high integration density, as shown in FIG. 9.

Figure 1A:
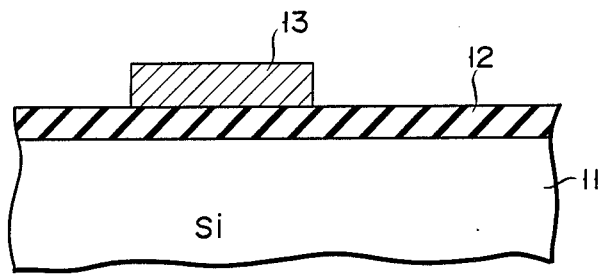
FIGS. 1A to 1C are explanatory views for explaining the steps of forming a conventional wire layer structure.
Figure 1B:
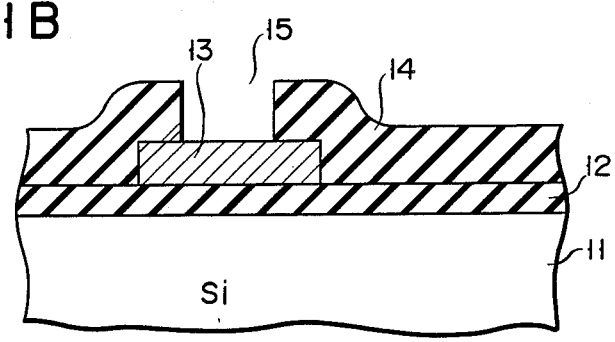
Figure 1C:
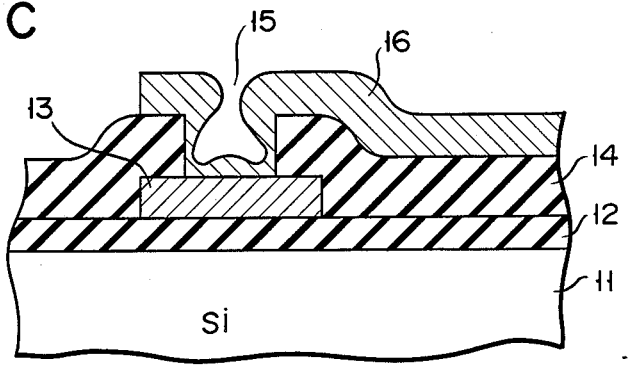
Figure 10A:
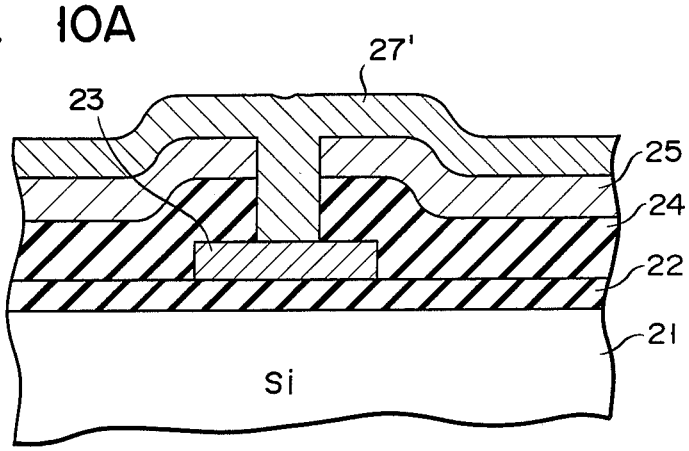
FIGS. 10A and 10B are views for explaining a modified form of the embodiment of FIGS. 8A to 8F.
Figure 10B:
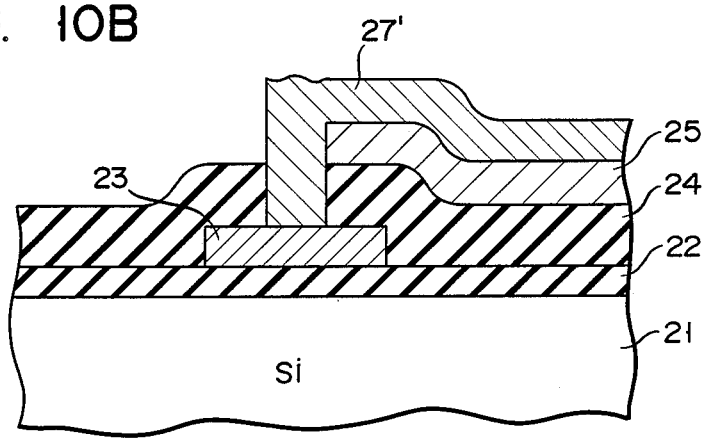

The aforementioned embodiment in which the patterning of the second wiring layer is conducted finally can be performed as shown in a modification of FIGS. 10A and 10B. In the modification of FIG. 10, conductive layer 27' is deposited in contact hole 26 and on the whole surface of layer 25. Then Al film 25 and conductive layer 27' are patterned as one unit to provide a second wiring layer as shown in FIG. 10B. Since the contact hole is completely filled with conductive layer 27', it is possible to prevent a possible damage to first wiring layer 23 in the patterning step. Furthermore, this modification can be implemented without any selective CVD technique. Where use is made of, for example, CVD conductive layer 27' of poly-Si, the contact hole can completely be filled with a wiring layer which has ordinarily been used as such. This situation is markedly different from that in which the Al film formed by the sputtering method. In case of Al-sputtering, the obtained Al film is thinned at the side wall of the contact hole as already set forth above in connection with FIG. 1C.

With reference to FIGS. 11A to 11D, the modification of FIG. 10 will now be explained below as being applied to the manufacture of a DRAM.

Figure 11A:
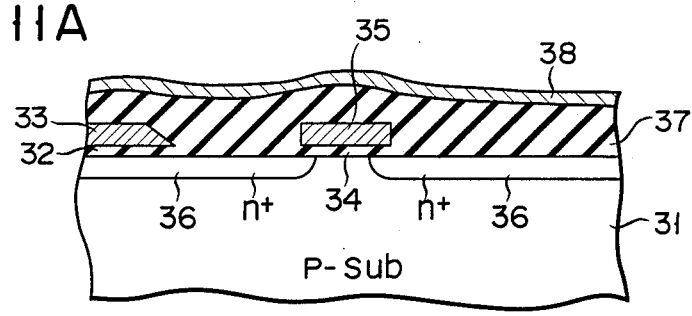
FIGS. 11A to 11D and FIG. 12 are explaining views for showing the application of the embodiment of FIGS. 10A and 10B to the manufacture of a DRAM.
Figure 11B:
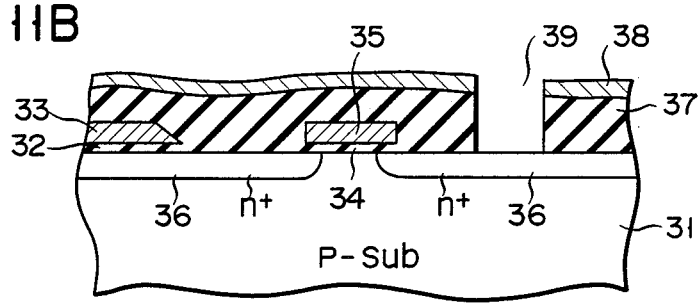

With the use of P type silicon substrate 31, the state as shown in FIG. 11A is obtained in accordance with an ordinary DRAM process. After an element isolation step, capacitor insulating film 32, capacitor electrode 33, gate insulating film 34, gate electrode 35 and N+ type source/drain diffusion layers 36 are formed. Then insulation interlayer 37 is formed to provide a flattened surface. As a method for obtaining a flattened surface, use may be made of a method for doping P or B doped $CVD-SiO_2$ film so that the $CVD-SiO_2$ film may be melt at a relatively low temperature. Low-ohmic film 38 which is formed of an $MoSi_2$ film of, for example, around 2000 Å is deposited on insulation interlayer 37 to obtain the state as shown in FIG. 11A. As shown in FIG. 11B, contact hole 39 is formed which extends onto source/drain diffusion layer 36.

Figure 11C:
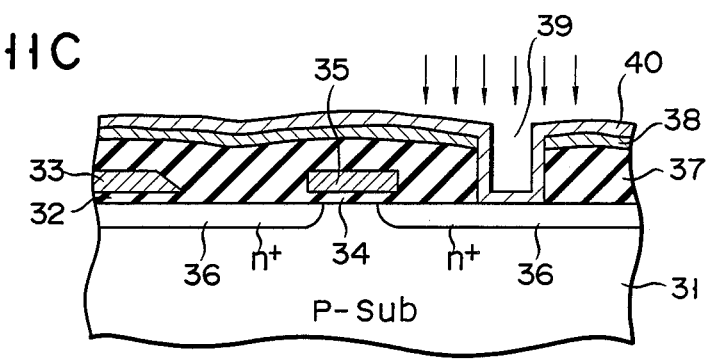
Figure 11D:
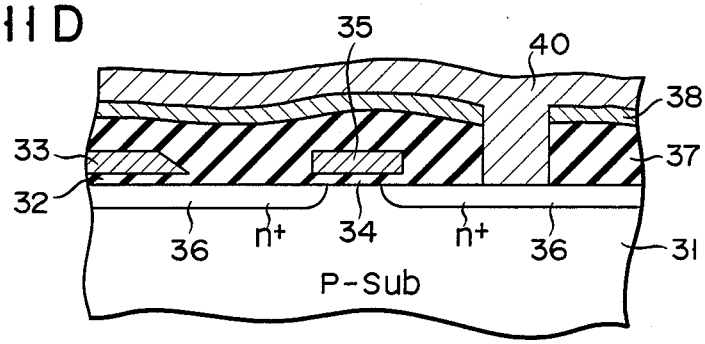
Figure 12:
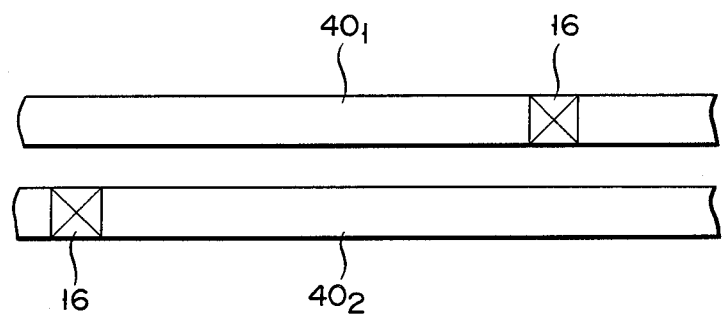

Then the contact hole is filled with a poly-Si film. It is desirable that the following ion mixing method be employed in order to prevent the degradation of electric conduction which may occur by a natural oxide on that silicon substrate surface at the contact hole. As shown in FIG. 11C, thin poly-Si film 40 is deposited by the CVD method on the low-ohmic film 38 and on the inner wall of the contact hole as shown in FIG. 11C in which case the thickness of poly-Si film 40 is, for example, about 500 Å. In this state, for example, arsenic ions are implanted at an acceleration voltage of 90 KeV and a dose of $2\times10^{16}$ atoms/cm². Then an annealing step is performed, for example, for 20 minutes in a nitrogen gas atmosphere at 900° C. to allow the implanted arsenic to be diffused. By doing so, a better electric connection is created between poly-Si film 40 and source/drain diffusion layer 36. Then the impurity-contained poly-Si layer is deposited at the thickness of about 3000 Å by means of the CVD method to completely fill the contact hole as shown in FIG. 11D. It is not necessary to specifically restrict the thickness of the deposited layer. If it is necessary to increase the thickness of the deposited layer so that the contact hole may be filled with the deposited layer, then the surface of poly-Si film 40 may be etched to obtain a desired thickness. Finally, poly-Si film 40 and MoSi film are patterned as one unit to provide bit lines for DRAM. FIG. 12 is a plan view showing two adjacent bit lines $40_1$ and $40_2$. In this embodiment, source/drain diffusion layer 36 corresponds to the first wiring layer and bit lines $40_1$ and $40_2$ correspond to the second wiring layer as in the case of FIG. 7.

As set out above, the application of this invention to the manufacture of the DRAM obviates, as in the case of the preceding embodiment, the need of broadening the bit line at the location of the contact portion. As a result, it is possible to narrow the distance, between the bit lines, down to the minimum working dimension and thus to implement DRAMs in high integration density with the cell area miniaturized. Furthermore it is also possible to obtain an electric connection at the contact location and thus to make an electrical connection between the wiring layers with high reliability and improved flatness.

What is claimed is:

1. A method for manufacturing a semiconductor device, comprising the steps of:
   (a) forming a first conductive pattern;
   (b) forming an insulation interlayer so that it covers the first conductive pattern;
   (c) forming, on the insulation interlayer, a conductive film on which a second conductive pattern is formed;
   (d) forming a contact hole, at a predetermined location, in both said conductive film and said insulation interlayer, so that said contact hole reaches said first conductive pattern;
   (e) forming a conductive layer for both covering the interior of the contact hole and directly covering the upper surface of the conductive film, so that a wiring is made between the conductive film and the first conductive pattern; and
   (f) subsequent to the formation of said conductive layer by step (e), selectively etching said conductive film and said conductive layer, to form the second conductive pattern.

2. The method according to claim 1, wherein said step for forming a conductive layer is performed by use of the CVD method.

3. The method according to claim 2, wherein poly-Si is used as said conductive layer.

4. The method according to claim 3, wherein Al issued as said conductive film for said second conductive pattern.

5. The method according to claim 3, wherein an $MoSi_2$ film is used as said conductive film for said second conductive pattern.

6. The method according to claim 5, wherein said second conductive pattern is a DRAM bit line.

7. The method according to claim 1, wherein said conductive layer is formed so that said contact hole is completely filled with said conductive layer.

8. The method according to claim 1, wherein said first conductive pattern is a first wiring layer.

9. The method according to claim 1, wherein said first conductive pattern is an impurity diffusion layer formed in a semiconductor layer.

* * * * *